United States Patent [19]
Foran

[11] Patent Number: 5,461,343
[45] Date of Patent: Oct. 24, 1995

[54] CURRENT MIRROR CIRCUIT

[75] Inventor: Ryan P. Foran, Summerfield, N.C.

[73] Assignee: Analog Devices Inc., Norwood, Mass.

[21] Appl. No.: 274,230

[22] Filed: Jul. 13, 1994

[51] Int. Cl.⁶ ..................................................... H03F 1/34
[52] U.S. Cl. ......................................... 330/288; 330/293
[58] Field of Search .................................. 330/288, 291, 330/292, 293; 323/315, 316

[56] References Cited

U.S. PATENT DOCUMENTS

| | | | |
|---|---|---|---|
| 4,333,120 | 6/1982 | Kotowski | 330/288 X |
| 4,609,880 | 9/1986 | Dermitzakis et al. | 330/288 X |
| 4,873,673 | 10/1989 | Hori et al. | 365/230.06 |
| 5,025,204 | 6/1991 | Su | 323/274 |
| 5,089,769 | 2/1992 | Petty et al. | 323/316 |
| 5,166,702 | 11/1992 | Mattern et al. | 346/107 R |
| 5,248,932 | 9/1993 | Prentice | 323/315 |
| 5,283,537 | 2/1994 | Nakamura | 330/288 |
| 5,285,172 | 2/1994 | Okanobu et al. | 330/288 |
| 5,311,146 | 5/1994 | Brannon et al. | 330/288 |

Primary Examiner—Steven Mottola
Attorney, Agent, or Firm—Samuels, Gauthier & Stevens

[57] ABSTRACT

A current mirror circuit and method of generating an output current at an output node which is proportional to an input current applied to an input node. The circuit operates to receive the input current and develops a reference voltage. The reference voltage is converted to a reference current which is proportional to the input current and is applied to a high impedance node. A feedback network is coupled to said high impedance node and includes an output device driven by the high impedance node and which provides the output current to the output node. The feedback network is operable for forcing current generated by said feedback network to the high impedance node to be equal to the reference current.

11 Claims, 2 Drawing Sheets

CURRENT MIRROR CIRCUIT

BACKGROUND OF THE INVENTION

The present invention relates to a current mirror circuit utilizing a resistor ratio to produce an output current which is proportional to an input current.

Current mirror circuits are some of the most fundamental building blocks of analog integrated circuit design. Typical current mirror applications include current sources used for biasing and active loads which are part of an AC signal path. Current mirrors can also be used as fixed-gain current multipliers by ratioing the emitter areas of the transistors in the mirror. Some desirable current mirror attributes include accuracy, thermal immunity, low voltage drop and maximum output compliance, and high speed. Most precision current mirrors achieve their accuracy at the sacrifice of voltage drop, output compliance and speed. Moderate thermal immunity and improved accuracy can be achieved by degenerating the mirror with resistors which can generally be matched in an integrated process better than transistors.

High current applications such as laser diode drivers can require better thermal immunity than can be achieved by simply degenerating the mirror, especially when the mirror's current ratio is other than one. Traditional current mirrors, such as the one shown in FIG. 1, are inherently thermally dependent as they rely on the base-emitter voltage of a transistor to determine the output current and the base-emitter voltage and collector current relationship of a transistor is very temperature dependent.

Conventional current mirror circuits typically are comprised of a diode-connected transistor coupled across the base-emitter of an output transistor wherein the former biases the latter. With reference to FIG. 1, there is shown a prior art current mirror circuit 10 which includes transistor 12 connected as a diode having its collector and base interconnected to input 14 while its emitter is returned to power supply rail 18. The base of transistor 12 is also connected to the base of transistor 16, the emitter of which is coupled to rail 18 while an output current is provided at output 20. An input current is supplied to the diode-connected transistor, which has its collector and base interconnected to the base of the output transistor while the emitters of the two devices are interconnected. By emitter area ratioing of the two transistors, an output current is developed at the collector of the output transistor that can be less than, greater than or equal to the input current.

A typical problem with conventional current mirror circuits of this type is related to poor thermal matching between input and output transistors. In addition, for current ratios that are not one, matching becomes very difficult in conventional circuits because identical transistors cannot be used.

Accordingly, it is an object of the present invention to provide a current mirror circuit which provides a means of implementing a current mirror with an arbitrary, but fixed, current ratio for high current and high power dissipation environments in which the load voltage is unknown and maximum output compliance is required.

It is another object of the present invention to provide a current mirror circuit which provides a means for implementing a current mirror with an arbitrary, but fixed, current ratio for high current and high power environments which require excellent thermal immunity, low voltage drop, and maximum output compliance, while achieving the maximum possible speed (bandwidth).

SUMMARY OF THE INVENTION

The present invention provides a current mirror circuit and method of generating an output current at an output node which is proportional to an input current applied to an input node. The circuit operates to receive the input current and develops a reference voltage. The reference voltage is converted to a reference current which is proportional to the input current and is applied to a high impedance node. A feedback network is coupled to said high impedance node and includes an output device driven by the high impedance node and which provides the output current to the output node. The feedback network is operable for forcing current generated by said feedback network to the high impedance node to be equal to the reference current.

DETAILED DESCRIPTION OF THE ILLUSTRATED EMBODIMENTS

Figure 1:
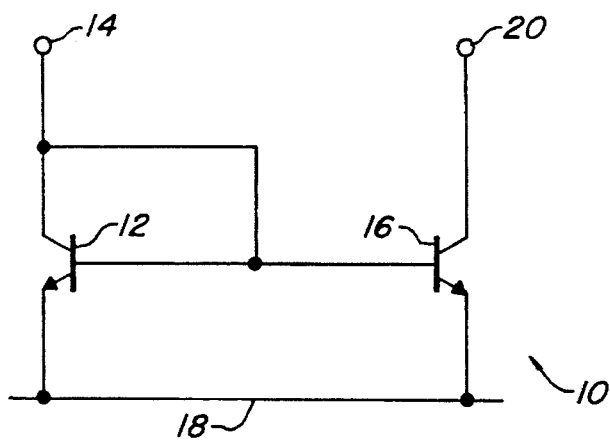
FIG. 1 shows a schematic diagram of a simple prior art current mirror circuit.
Figure 2:
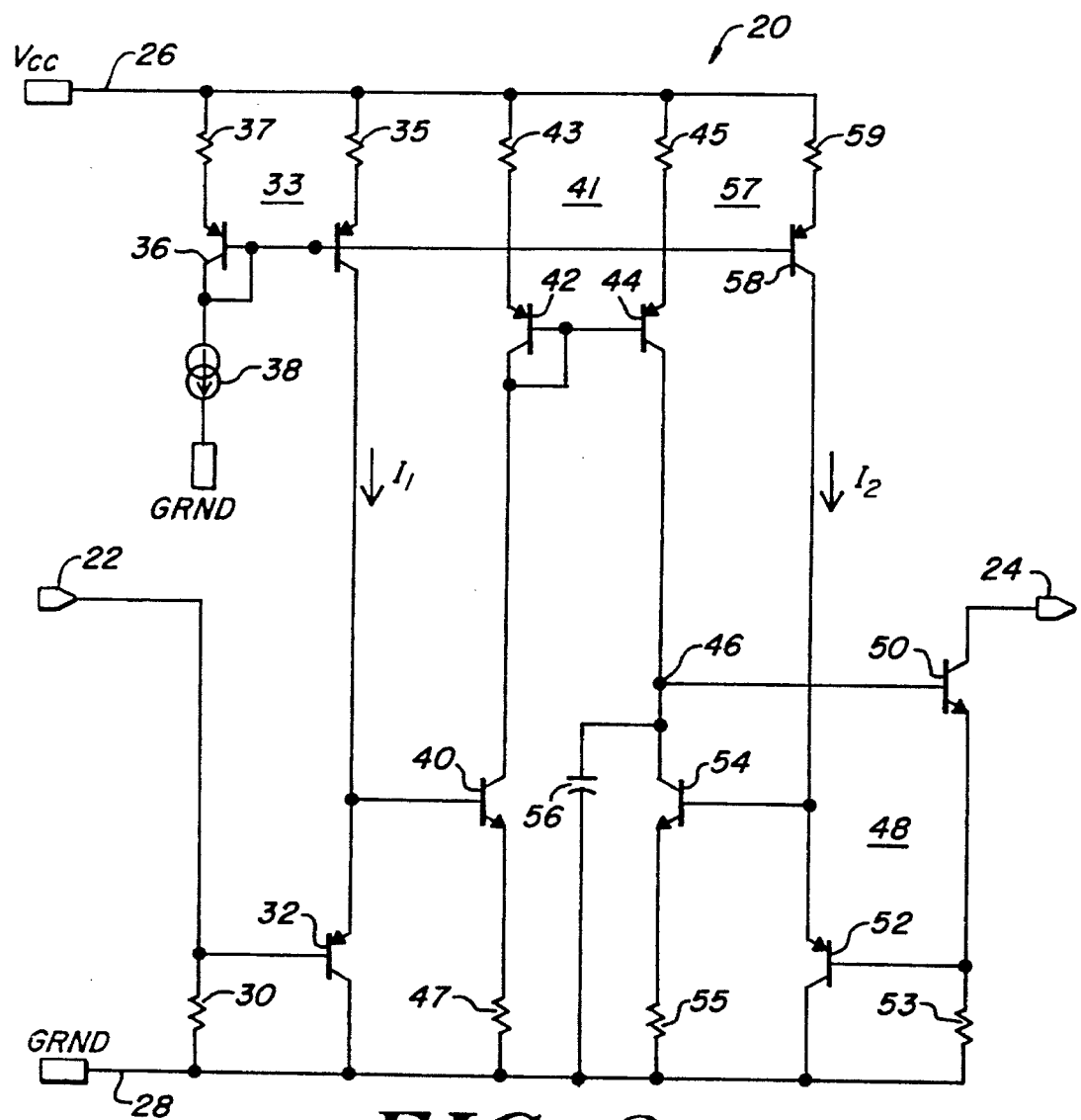
FIG. 2 shows a schematic diagram of a current mirror circuit in accordance with the present invention.

FIG. 2 shows a circuit schematic diagram of a current mirror 20 which operates as a current sinking device in accordance with the present invention. The current mirror circuit 20 includes an input node 22, an output node 24, a positive voltage supply rail 26 and a ground or negative voltage supply rail 28. The input node is coupled to one side of a conversion resistor 30, the other side of which is tied to the ground rail 28, and to the base of a level shifting PNP transistor 32. The collector of the transistor 32 is tied to the ground rail while the emitter is coupled to both a DC current source 33 and the base of NPN transistor 40. The DC current source 33 is configured as a simple current mirror having PNP transistors 34 and 36 whose bases are tied together and whose emitters are respectively coupled to the positive voltage rail 26 via resistors 35 and 37. A DC current source 38 which could be configured as a bandgap circuit or a resistor tied to a potential source supplies current to the collector and base of transistor 36. Accordingly, the current provided by the DC current source 33 is developed at the collector of transistor 34.

The emitter of transistor 40 is coupled to the ground rail 28 via a resistor 47. The collector of transistor 40 is coupled to another internal current mirror circuit 41 which includes PNP transistors 42 and 44 with common base connections and whose emitters are respectively coupled to the positive voltage rail 26 through resistors 43 and 45. Resistors 43 and 45 serve to provide improved accuracy and increased output resistance in output resistance of circuit 41. The collector of transistor 42 is tied to both the collector of transistor 40 and the base connection between transistors 42 and 44.

The collector of transistor 44 is coupled directly to a gain or high impedance node 46. The high impedance node 46 is also coupled to a negative feedback network 48. The feedback network includes NPN transistors 50, 54 and PNP transistor 52 as well as resistors 53 and 55. The base of transistor 50 is coupled to the high impedance node 46, and its collector is tied to the output node 24. The emitter of transistor 50 is coupled to both one side of the resistor 53, the other side of which is tied to the ground rail 28, and to the base of transistor 52. The collector of transistor 52 is tied to the ground rail, and the emitter is coupled to both the base of transistor 54 and to a second DC current source 57 which includes a transistor 58 having an emitter coupled to the positive voltage rail through a resistor 59 and a common base with the transistors 34 and 36 of the DC current source 33. Accordingly, the collector of transistor 58 is coupled to the emitter of transistor 52.

The emitter of transistor 54 is coupled to the ground rail 28 via the resistor 55, and the collector is tied to the high impedance node 46. In addition, the collector is also tied to the ground rail 28 through a capacitor 56. The capacitor 56 serves to establish the time constant at the high impedance node.

The current sinking operation of circuit 20 is as follows when an input current is supplied to node 22. The input current develops a reference voltage across resistor 30. The circuit 20 is in turn operable for holding the voltage developed across resistor 53 equal to this reference voltage across resistor 30. The reference voltage at the base of transistor 32 is followed directly by the emitter of transistor 32 so that there is a constant level shift of $1V_{be}$. Accordingly, the voltage at the input appears at the base of transistor 40 plus some offset, i.e., the $V_{be}$ of transistor 32. It will be appreciated that the current $I_1$ developed by the DC current source 33 maintains a constant $V_{be}$ for transistor 32, and similarly the current $I_2$ from the DC current source 57 maintains a constant $V_{be}$ for transistor 52. Therefore, a voltage now appears at the base of transistor 40 which follows the input voltage plus the $V_{be}$ offset. This voltage in turn develops a current through transistor 40 and resistor 47. The result being that the reference voltage across resistor 30 is approximately developed across resistor 47. The ratio of resistor 47 and resistor 30 determines the internal reference current through resistor 47. This internal reference current is mirrored by internal circuit 41 via transistors 42 and 44. In other words, the input voltage varies a current through resistor 47 and that current is reflected by the mirror circuit 41, with transistor 42 being the input, so that whatever current flows through transistor 40 goes through transistor 42 and is mirrored directly by transistor 44 at its collector, and therefore applied to the high impedance node 46.

The gain of the feedback network 48 is developed at the high impedance node 46, and therefore the bandwidth of the entire circuit is set by the time constant at this node. With a complementary fabrication process, sufficiently high node resistance is achieved using an active load including transistors 42, 44 and resistors 43 and 45, that the junction capacitance of transistors 50, 54 and 44 is sufficient to adequately compensate the feedback network. It will be appreciated that capacitor 56 can also be used to provide additional compensation. The primary function of the feedback network 48 is to hold the current through the collector of transistor 54 to be approximately equal to the collector current of transistor 44, taking into account the base current of transistor 50.

Any mismatch between the current generated by transistor 44 and going into transistor 54 provides a large voltage swing at the node 46. Such a mismatch would create an error signal. However, the circuit 20 forces the currents associated with transistors 44 and 54 to be equal in order to maintain circuit equilibrium. Accordingly, the result is that a high gain is achieved at the node 46, and the feedback network forces the current flowing through transistor 54 to be approximately equal to the current flowing through transistor 44.

In essence, transistors 32, 40, 42 and 44 as well as resistors 30 and 47 establish a reference current which is proportional to the input current. The feedback network 48 holds the current through transistor 54 to be equal to that reference current. If, for some reason, an error signal were present such that the current through transistor 54 was too low, i.e., not as high a magnitude as the current developed out of transistor 44, then there would be more current flowing into the high impedance node 46 than there was flowing out of it. This operation drives the voltage to increase at the base of transistor 50, which forces the voltage at the base of transistor 52 to increase, which in turn drives the voltages at the base and emitter of transistor 54 to increase. This action would cause the circuit to draw more current from high impedance node 46 which would decrease the voltage at the base of transistor 50 in order to bring the circuit back to equilibrium.

Similarly, if too much current somehow was flowing through the transistor 54, then there would be more current coming out of the high impedance node 46 than there would be going into it. This would cause the base of transistor 50 to be pulled down, the base of transistor 52 to be pulled down, and in turn the base and emitter of transistor 54 being pulled down which would decrease the current drawn from high impedance node 46 in order to equalize the current flow.

Accordingly, this negative feedback action results in the current through resistor 47 being approximately equivalent to the current through resistor 55. However, in order to maintain this status, due to the transistors 52 and 32 having equivalent $V_{be}$'s, and further due to the $V_{be}$'s of transistors 54 and 40 being equal, the result is that the base of transistor 32 and the base of transistor 52 must be at the same voltage. Therefore, the voltage across resistors 30 and 53 must be equivalent, thus the input current and the output current are proportionally related by the values of these resistors.

The above described circuit exhibits excellent thermal immunity in that conventional temperature dependence is removed by the fact that the determining factor of the output current lies in the ratio of resistors 30 and 53. In traditional current mirrors, the ratio of the current is dependent upon the voltage across the base emitter junction of two transistors, which are very temperature dependent. This is achievable in modern fabrication processes due to achieving resistors whose values are relatively temperature independent.

The circuit 20 further provides maximum possible output compliance in a low supply voltage environment. In other words, one can apply as much voltage to the circuit while the load can have as much voltage drop across it as possible. The combination of only having one $V_{be}$ output with the associated current thermal $V_{be}$ accuracy and bandwidth is not achieved in conventional circuits.

In addition, the circuit 20 is fast in that if the input current is pulsed, the output can respond very quickly. This feature is critical for desired applications utilizing the circuit as a driver for a laser diode.

The high bandwidth of this mirror is achieved by driving the base of the output transistor 50 directly with the high impedance (gain, dominant) node 46 of the circuit. It will be appreciated by those of skill in the art that transistor 50 could be implemented as any conventional transistor output device, such as a Darlington arrangement. In high current applications, such as laser diode drivers, the output transistor must be relatively large to facilitate the high current required. In most realizable integrated processes, the parasitic capacitance of this output device will be relatively large. The circuit of the present invention uses this large parasitic capacitance to help compensate the feedback loop 48. In conventional current mirrors where the parasitic capacitance of the output transistor is not included at the dominant node, the capacitance will create a second pole (the first being the dominant) in the feedback loop. This time constant of this second pole could be very significant compared to the dominant pole. In this case the time constant of the dominant pole would have to be increased, decreasing bandwidth, in order to maintain loop stability and reduce output overshoot. This is particularly important when driving current through a laser diode as any current overshoot can drastically effect the light output and even damage the laser diode.

The current mirror of the present invention uses this large parasitic capacitance to help compensate the feedback loop. When the dominant node is buffered from the output transistor, such as in the case of using as op-amp or emitter follower to drive the base of the output transistor, the bandwidth will be lower than the present invention for a given amount of overshoot.

Figure 3:
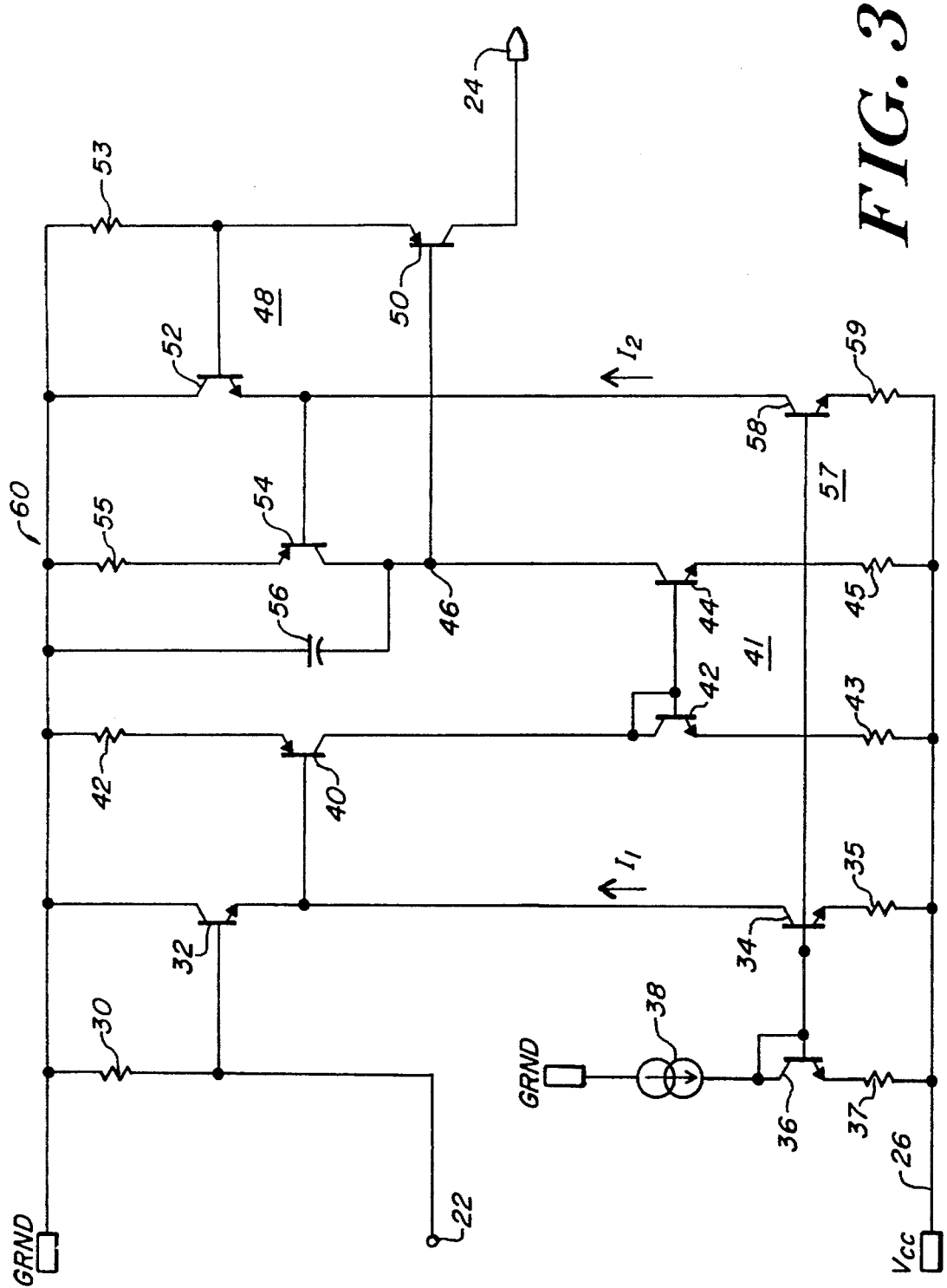
FIG. 3 shows an alternative embodiment of the current mirror circuit in accordance with the present invention.

With reference now to FIG. 3, an alternative embodiment of the present invention is shown as a current mirror circuit 60 which operates as a current sourcing device. The circuit 60 is complementary to the current mirror circuit 20 of FIG. 2 in that all of the elements are equivalent with the exception that NPN transistors are replaced with PNP transistors and vice versa. The operation of circuit 60 need not be detailed herein in that those of skill in the art will appreciate that the operation is similar to that of circuit 20 described with reference to FIG. 2.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A current mirror circuit for generating an output current at an output node which is proportional to an input current applied to an input node, said circuit comprising:

means for receiving said input current and developing a reference voltage;

means for converting said reference voltage to a reference current which is proportional to said input current and applying said reference current to a high impedance node; and a negative feedback network coupled to said high impedance node, said negative feedback network including an output device driven by said high impedance node and which provides said output current to said output node, said negative feedback network operable for forcing current generated by said negative feedback network to said high impedance node to be substantially equal to said reference current.

2. The circuit of claim 1 further comprising first and second potential sources.

3. The circuit of claim 2, wherein said output device comprises an output transistor having a base coupled to said high impedance node, an emitter coupled to said first potential and a collector coupled to said output node for providing said output current.

4. The circuit of claim 3, wherein said reference voltage developing means comprises a first resistor coupled between said input node and said first potential source.

5. The circuit of claim 4, wherein said feedback network further comprises a second resistor coupled between the emitter of said output transistor and said first potential.

6. The circuit of claim 5, wherein the proportional ratio between said input and output currents directly corresponds to the ratio of the resistance values of said first and second resistors.

7. The circuit of claim 5, wherein said feedback network further comprises:

a first transistor having a collector coupled to said first potential source, a base coupled to the emitter of said output transistor, and an emitter coupled to a current source, and a second transistor having an emitter coupled to said first potential source, a base coupled to said current source, and a collector coupled to said high impedance node.

8. The circuit of claim 5, wherein said converting means comprises a voltage buffering portion and a current mirroring portion.

9. The circuit of claim 8, wherein said voltage buffering portion comprises:

a first transistor having a base coupled to said input node, a collector coupled to said first potential source, and an emitter coupled to a current source, and a second transistor having a base coupled to the emitter of said first transistor, an emitter coupled through a third resistor to said first potential source, and a collector coupled to said current mirroring portion;

said reference current being developed through said third resistor in accordance with the ratio between said first and third resistors.

10. The circuit of claim 9, wherein said current mirroring portion comprises:

a third transistor having a collector coupled to the collector of said second transistor, an emitter coupled to said second potential source, and a base tied to said collector, and a fourth transistor having a base coupled to the base of said third transistor, an emitter coupled to said second potential source, and a collector coupled to said high impedance node;

said current mirroring portion receiving said reference current at the collector of said third transistor and generating an equivalent reference current at the collector of said fourth transistor which is applied to said high impedance node.

11. A method of generating an output current at an output node which is proportional to an input current applied to an input node, comprising the steps of:

receiving said input current and developing a reference voltage;

converting said reference voltage to a reference current which is proportional to said input current and applying said reference current to a high impedance node;

generating current with a negative feedback network coupled to said high impedance node which is equal to said reference current driving an output device with said high impedance node so as to provide said output current to said output node.

\* \* \* \* \*